(12) United States Patent  
Fang et al.

(10) Patent No.: US 8,673,768 B2  
(45) Date of Patent: Mar. 18, 2014

(54) FABRICATION METHOD FOR IMPROVING SURFACE PLANARITY AFTER TUNGSTEN CHEMICAL MECHANICAL POLISHING

(71) Applicant: Shanghai Huali Microelectronics Corporation, Shanghai (CN)

(72) Inventors: Jingxun Fang, Shanghai (CN); Chuanmin Zhang, Shanghai (CN); Wei Zuo, Shanghai (CN); Xiaogang Tong, Shanghai (CN); Zhe Wang, Shanghai (CN); Lei Deng, Shanghai (CN); Jing Wen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/730,103

(22) Filed: Dec. 28, 2012

(65) Prior Publication Data

US 2013/0224949 A1    Aug. 29, 2013

(30) Foreign Application Priority Data

Feb. 28, 2012  (CN) .......................... 2012 1 0048734

(51) Int. Cl.  
    *H01L 21/4763*  (2006.01)  
    *H01L 21/44*  (2006.01)

(52) U.S. Cl.  
    USPC ................... 438/633; 438/692; 257/E21.583

(58) Field of Classification Search  
    USPC .......... 438/627, 633, 691–692; 257/E21.583, 257/E21.575, E21.576  
    See application file for complete search history.

(56) References Cited

U.S. PATENT DOCUMENTS

2007/0093057 A1* 4/2007 Chen et al. .................... 438/683  
2009/0166750 A1* 7/2009 Eda .............................. 257/369

* cited by examiner

*Primary Examiner* — Thanhha Pham  
(74) *Attorney, Agent, or Firm* — Muncy, Geissler, Olds & Lowe, P.C.

(57) ABSTRACT

A fabrication method for improving surface planarity after tungsten chemical mechanical polishing (W-CMP) is disclosed. The method forms contact holes and dummy patterns by performing two respective photolithography-and-etching processes to ensure that the dummy patterns have a depth smaller than that of the contact holes. Then the method fills tungsten into the contact holes and dummy patterns and removes the redundant tungsten by a W-CMP process. With such a method, difference of wiring density between areas can be reduced by the dummy patterns, and hence a better surface planarity of the contact hole layer can be achieved. Besides, as the dummy patterns are formed in a pre-metal dielectric layer and their depth is well controlled, tungsten filled in the dummy patterns will not contact with the device area below the pre-metal dielectric layer, and thus will not affect the performance of the device.

7 Claims, 4 Drawing Sheets

FABRICATION METHOD FOR IMPROVING SURFACE PLANARITY AFTER TUNGSTEN CHEMICAL MECHANICAL POLISHING

CROSS-REFERENCES TO RELATED APPLICATIONS

This application claims the priority of Chinese patent application number 201210048734.8, filed on Feb. 28, 2012, the entire contents of which are incorporated herein by reference.

TECHNICAL FIELD

The present invention relates to microelectronics, and more particularly, to a fabrication method for improving surface planarity after tungsten chemical mechanical polishing (W-CMP).

BACKGROUND

With the development of very-large-scale integration (VLSI), the critical dimension of ICs continues to decrease and the integration of ICs continues to increase, back end interconnections generally adopt wirings with three-dimensional architectures and multiple layers. Meanwhile, copper (Cu) interconnection has many advantages incomparable with aluminum interconnection for the fabrication of ICs at 130 nm technology node and below, and has thus become the dominant interconnection process. Damascene process is indispensable in the realization of multilayer copper interconnection structure. A Damascene process typically includes the steps of: depositing an insulating dielectric layer, etching conductive wire trenches and contact holes, depositing a diffusion barrier layer and a copper seed layer, copper electroplating, and chemical mechanical polishing (CMP) of copper.

Among these steps, the CMP step is the most critical part for the success of copper interconnections, because CMP is the only process which may achieve global planarization. However, in a Cu-CMP process, non-uniformity of copper wiring density will lead to defects, such as dishing 2 and erosion 1 shown in FIG. 1, in certain areas, for example, where wires are relatively wide, or where wiring densities are relatively high. These defects will affect post-CMP surface planarity and hence lower the production yield and reliability. On the other hand, in the case of multilayer wiring, CMP process itself also requires a good surface planarity, because surface non-planarity will accumulate with the increase of layers and may finally lead to the metal residue or defects, such as pooling and bridging, in certain areas during subsequent processes of forming copper interconnections.

In general practice, inserting dummy patterns into blank areas during wiring layout design is a practical way to improve surface planarity after a Cu-CMP process, the uniformity of wiring density throughout the whole metal layer surface can be improved. A high effectiveness of this method in Cu-CMP for processing interconnection layers has been confirmed in practical use.

However, in addition to the quality of the Cu-CMP process, the surface planarity of the copper interconnection layer is also related to the surface planarity of the contact hole layer located directly under the copper interconnection layer. Therefore, a method of improving the surface planarity of the contact hole layer is needed.

SUMMARY OF THE INVENTION

The present invention is directed to a fabrication method for improving surface planarity after tungsten chemical mechanical polishing (W-CMP) so as to ensure a good surface planarity of the copper interconnections to be formed in a subsequent process.

To achieve the above objective, the present invention provides a fabrication method for improving surface planarity after tungsten chemical mechanical polishing (W-CMP), the method including the steps of:

providing a substrate having at least one device formed thereon;

forming a pre-metal dielectric layer over surface of the substrate;

forming contact holes and dummy patterns in the pre-metal dielectric layer by two respective processes of photolithography-and-etching, wherein the contact holes are formed through the pre-metal dielectric layer, while the dummy patterns have a depth smaller than that of the contact holes;

forming a tungsten layer over surface of the pre-metal dielectric layer, such that the contact holes and the dummy patterns are filled with tungsten; and removing the portion of the tungsten layer above the pre-metal dielectric layer with a W-CMP process to form tungsten contact layers in the contact holes and dummy metal layers in the dummy patterns.

In an embodiment, in the fabrication method for improving surface planarity after W-CMP, the step of performing two respective photolithography-and-etching processes to form contact holes and dummy patterns includes: performing a first photolithography-and-etching process to form the contact holes; and performing a second photolithography-and-etching process to form the dummy patterns.

In an embodiment, in the fabrication method for improving surface planarity after W-CMP, the step of performing two respective photolithography-and-etching processes to form contact holes and dummy patterns includes: performing a first photolithography-and-etching process to form the dummy patterns; and performing a second photolithography-and-etching process to form the contact holes.

The fabrication method for improving surface planarity after W-CMP may further include a step of forming a metal barrier layer over surface of the pre-metal dielectric layer and over inner surfaces of the contact holes and the dummy patterns before the step of forming a tungsten layer over surface of the pre-metal dielectric layer.

In the fabrication method for improving surface planarity after W-CMP, the dummy patterns have a round or rectangular shape.

In the fabrication method for improving surface planarity after W-CMP, a minimum distance between a dummy pattern and a contact hole is greater than 0.5 μm.

In the fabrication method for improving surface planarity after W-CMP, the dummy patterns have a critical dimension of 0.01 μm to 2.0 μm.

In the fabrication method for improving surface planarity after W-CMP, the dummy patterns have a depth of 100 Å to 1000 Å.

The fabrication method of the present invention first forms contact holes and dummy patterns shallower than the contact holes with two respective photolithography-and-etching processes, and then fills tungsten into the contact holes and the dummy patterns and thereafter removes the redundant tungsten by a W-CMP process, so as to form tungsten contact layers in the contact holes and dummy metal layers in the dummy patterns. By using this method, wiring density difference between different areas can be reduced by the formed dummy patterns while metal filled in the dummy patterns will not contact with or be close to gate electrodes or active-area silicides, and thus will not affect the performance of the device. Therefore, the fabrication method of the present invention is capable of improving surface planarity after W-CMP and hence preventing the generation of metal residues in subsequent processes of forming copper interconnections.

DETAILED DESCRIPTION

Foregoing objectives, characteristics and advantages of the present invention will be clearer and easier to be understood upon reading the following description of specific embodiments with reference to the accompanying drawings.

A contact hole layer which locates under a copper interconnection layer is generally formed by tungsten (W), and is generally planarized by using a W-CMP process. Similar to the Cu-CMP process, the surface planarity after W-CMP may be improved by inserting dummy patterns in the layout of the contact hole layer. However, if dummy patterns are formed simultaneously with contact holes by using one photolithography-and-etching process, this will lead to the formation of dummy patterns that have a same depth with that of the contact holes, meaning that the dummy patterns formed will also be through the pre-metal dielectric (PMD) layer, thus creating a high possibility for metal filled in the dummy patterns to contact with gate electrodes and active-area silicides of the underlying metal-oxide-semiconductor (MOS) devices and hence affect their performance. On the other hand, if dummy patterns are not inserted, satisfactory planarity could not be guaranteed for W-CMP processed surfaces and good back end interconnections could not be ensured. For example, there could be a deviation of up to 1000 Å in surface planarity after W-CMP for certain layout designs of the contact hole layer. Affected by this issue of surface non-planarity, there is a problem that a huge amount of metal residues will be generated in the first copper interconnection layer even after it has been Cu-CMP processed.

Figure 1:
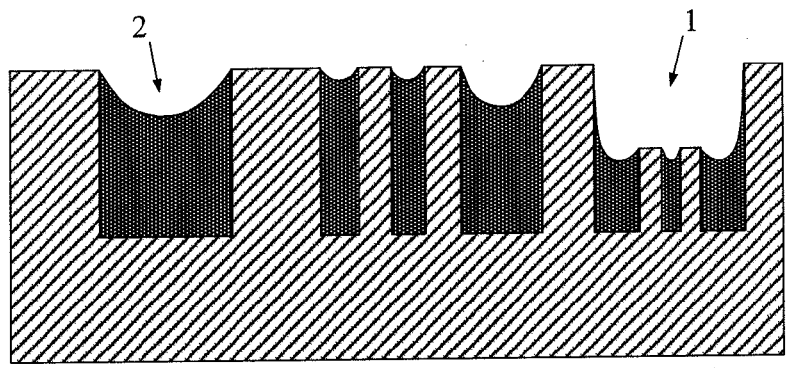
FIG. 1 is a cross-sectional view illustrating the surface of a silicon wafer after copper chemical mechanical polishing (Cu-CMP) according to the prior art.
Figure 2:
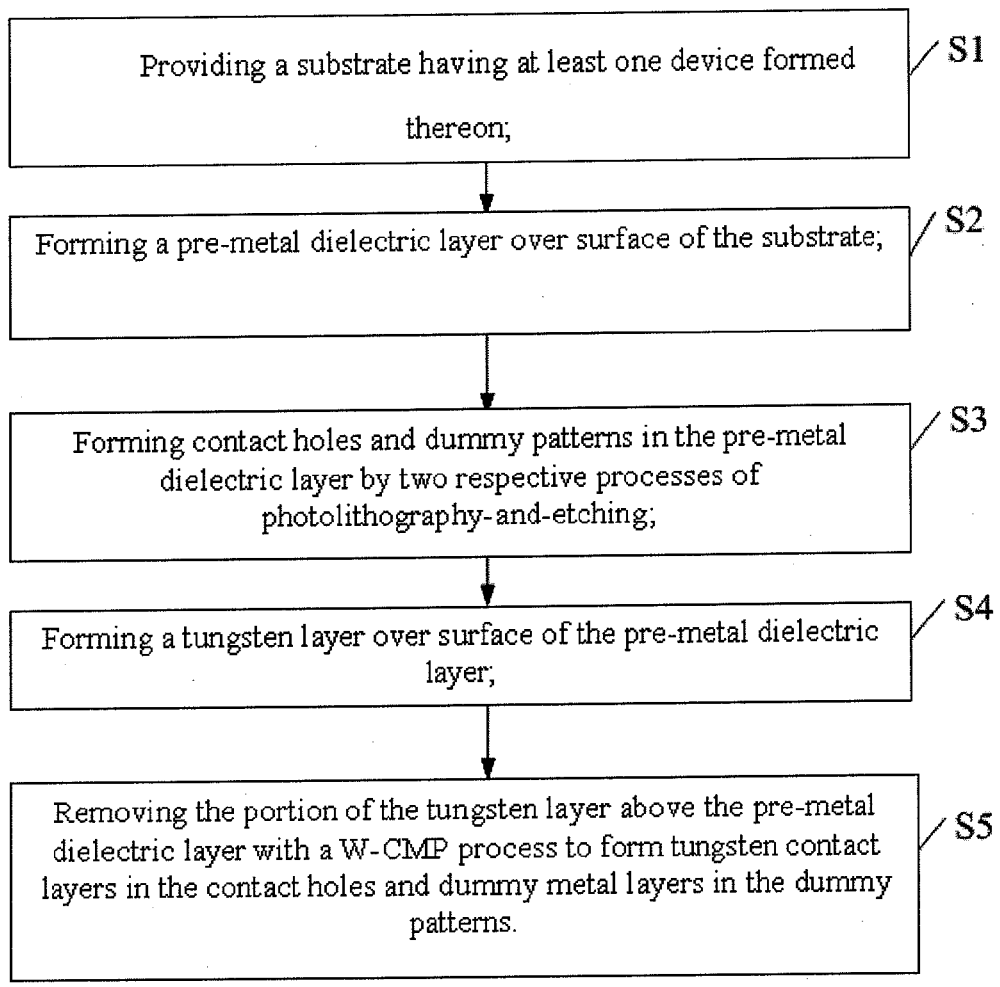
FIG. 2 is a flow chart illustrating a fabrication method for improving surface planarity after tungsten chemical mechanical polishing (W-CMP) according to an embodiment of the present invention.

To this end, as shown in FIG. 2, the present invention provides a fabrication method for improving surface planarity after tungsten chemical mechanical polishing (W-CMP). The method includes the steps S1 to S5 which will be described and specified below.

Figure 3:
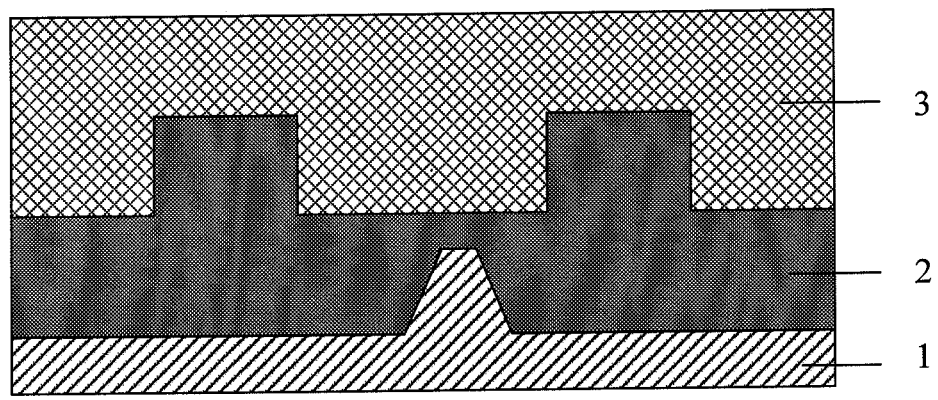
FIGS. 3 to 7 are cross-sectional views illustrating a device through various processing steps of a fabrication method for improving surface planarity after W-CMP according to an embodiment of the present invention.

Referring to FIG. 3 which represents that in a first step S1, a substrate 1 having one or more devices 2 formed therein is provided. In this embodiment, the devices 2 are complementary metal oxide semiconductor (CMOS) devices. As the present invention does not involve any modification of the structures of CMOS devices, it will not be further detailed herein.

Next, referring to FIG. 3 which represents that in a second step S2, a pre-metal dielectric (PMD) layer is deposited on the substrate 1, and after that, the PMD layer is chemically and mechanically polished and thereby a planar PMD layer 3 is formed.

Next, in a third step S3, two photolithography-and-etching processes are carried out to form contact holes 4 and dummy patterns 5, respectively. The contact holes 4 are formed through the PMD layer 3. The dummy patterns 5 have a depth smaller than that of the contact holes 4, i.e., the dummy patterns 5 are not so deep as to be through the PMD layer 3.

Figure 4:
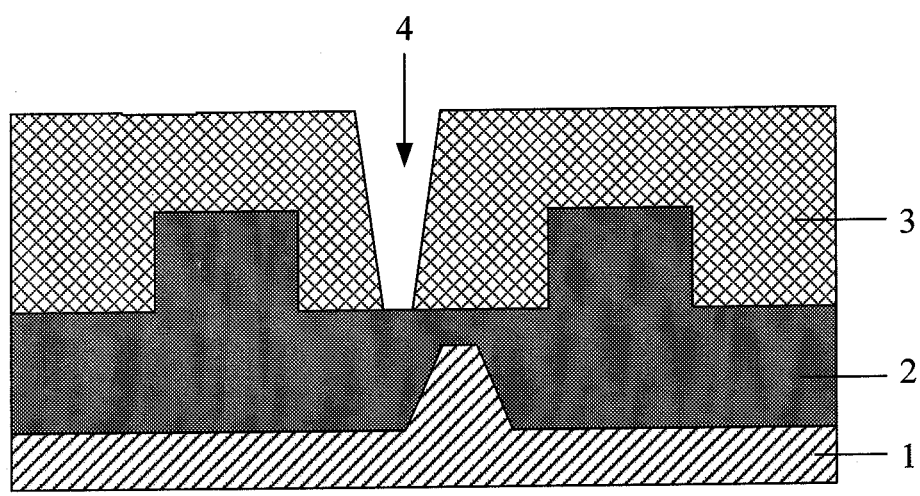
Figure 5:
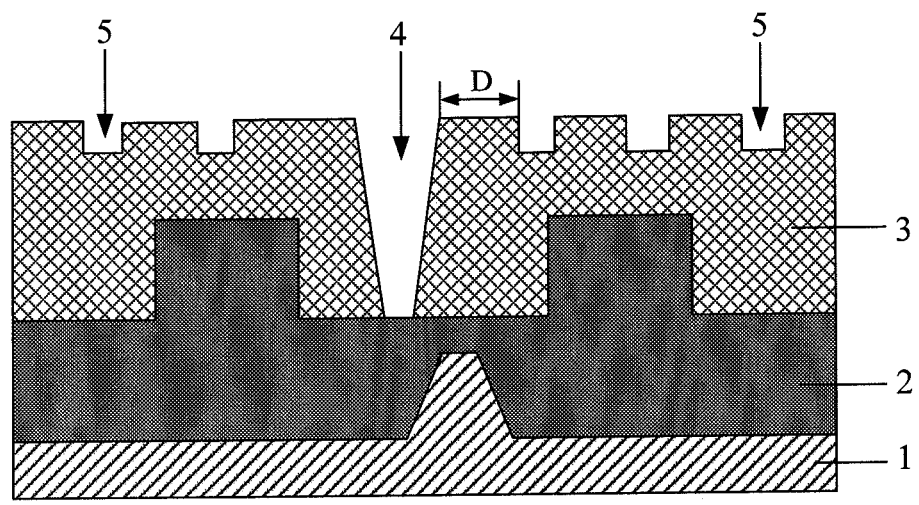

In this embodiment, as shown in FIG. 4, a photolithography-and-etching process is first carried out to form the contact holes 4 which are through the PMD layer 3, and next, as shown in FIG. 5, another photolithography-and-etching process is carried out to form the dummy patterns 5 by etching the PMD layer 3, and the dummy patterns 5 are not so deep as to be through the PMD layer 3.

After this step, difference in pattern density between adjacent areas is within the range of 2% to 50%. The minimum distance D between each of the contact holes 4 and each of the dummy patterns 5 is within the range of 0.5 μm to 10 μm. Optionally, the dummy patterns 5 may have any shape of, for example, round, rectangular, or the like. The dummy patterns 5 have a critical dimension that is nearly equal to that of the contact holes, both in the range of 0.01 μm to 2.0 μm. The dummy patterns 5 have a depth of 100 Å to 1000 Å, such that they are isolated by a certain distance from gate electrodes of the devices 2. In such a manner, dummy metal layers described below that are formed in the dummy patterns 5 will not contact with the gate electrodes or metal silicides formed in active areas of the devices and therefore will not affect their performance. It should be appreciated herein that the depth of the dummy patterns 5 may be properly adjusted according to the thickness of the PMD layer 3 only if it does not allow the dummy patterns 5 to be through the PMD layer 3, i.e., it does not allow the dummy patterns 5 to contact with the gate electrodes or active-area metal silicides.

In the method of the present invention, the dummy patterns 5 and the contact holes 4 are independently formed from each other. Therefore, they may be formed in either order, i.e., the dummy patterns 5 may be formed before forming the contact holes 4, and vice versa. Moreover, as described above, as dummy patterns 5 may be separately designed and formed, they can be added to reduce difference of wiring density between different areas while metal filled in them are being prevented from contacting with gate electrodes or active-area silicides and thus will not affect the performance of the devices. Therefore, surface planarity after W-CMP can be improved and hence the generation of metal residues or defects, such as pooling and bridging, in subsequent processes of forming copper interconnections can be prevented.

Figure 6:
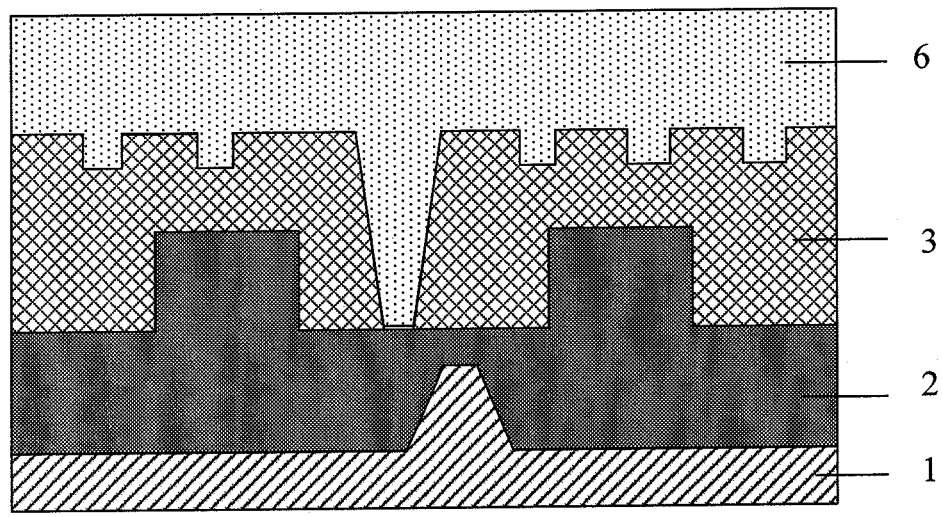

Next, as shown in FIG. 6, in a fourth step S4, a tungsten layer 6 is formed over surface of the PMD layer 3, such that the contact holes 4 and the dummy patterns 5 are filled with tungsten.

Before the step S4, a barrier metal layer for blocking metal diffusion may be further formed over surface of the PMD layer 3, and over inner surfaces of the contact holes 4 and the dummy patterns 5.

Figure 7:
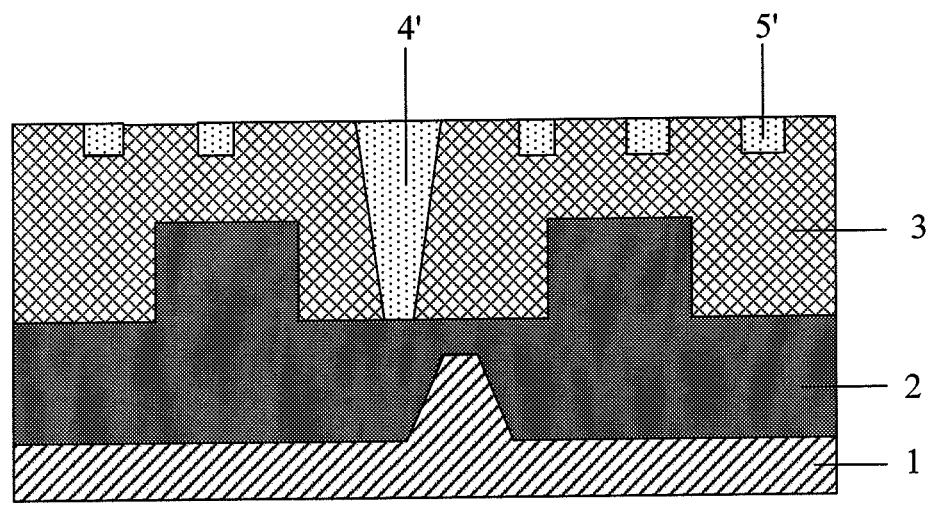

After that, as shown in FIG. 7, in a fifth step S5, remove the undesired portion of the tungsten layer above the PMD layer 3 by a W-CMP process so as to form tungsten contact layers 4' within the contact holes 4 and dummy metal layers 5' within the dummy patterns 5.

Note that FIGS. 3 to 7 are provided merely to depict main steps of the fabrication method for improving surface planarity after W-CMP in a schematic manner, and are not intended to illustrate conventional structures of devices in details, for example those of CMOS devices, that are well known to those skilled in the art.

Obviously, those skilled in the art can make various modifications and variations without departing from the spirit or scope of the invention. Thus, it is intended that the present invention cover such modifications and variations provided they come within the scope of the appended claims and their equivalents.

What is claimed is:

1. A fabrication method for improving surface planarity after tungsten chemical mechanical polishing (W-CMP), the method comprising the steps of:
    providing a substrate having at least one device formed thereon;
    forming a pre-metal dielectric layer over surface of the substrate;
    forming contact holes and dummy patterns in the pre-metal dielectric layer by two respective processes of photolithography-and-etching, wherein the contact holes are formed through the pre-metal dielectric layer, while the dummy patterns have a depth smaller than a depth of the contact holes, and wherein each of the contact holes is a distance of 0.5 μm to 10 μm from a dummy pattern closest thereto;
    forming a tungsten layer over surface of the pre-metal dielectric layer, such that the contact holes and the dummy patterns are filled with tungsten; and
    removing the portion of the tungsten layer above the pre-metal dielectric layer with a W-CMP process to form tungsten contact layers in the contact holes and dummy metal layers in the dummy patterns.

2. The fabrication method according to claim 1, wherein the step of forming contact holes and dummy patterns in the pre-metal dielectric layer by two respective processes of photolithography-and-etching includes:
    forming the contact holes by a first photolithography-and-etching process; and
    forming the dummy patterns by a second photolithography-and-etching process.

3. The fabrication method according to claim 1, wherein the step of forming contact holes and dummy patterns in the pre-metal dielectric layer by two respective processes of photolithography-and-etching includes:
    forming the dummy patterns by a first photolithography-and-etching process; and
    forming the contact holes by a second photolithography-and-etching process.

4. The fabrication method according to claim 1, further comprising a step of forming a metal barrier layer over surface of the pre-metal dielectric layer and over inner surfaces of the contact holes and the dummy patterns before the step of forming a tungsten layer over surface of the pre-metal dielectric layer.

5. The fabrication method according to claim 1, wherein the dummy patterns have a round or rectangular shape.

6. The fabrication method according to claim 1, wherein the dummy patterns have a critical dimension of 0.01 μm to 2.0 μm.

7. The fabrication method according to claim 1, wherein the dummy patterns have a depth of 100 Å to 1000 Å.

* * * * *